(12) United States Patent
Ahmed et al.

(10) Patent No.: US 9,513,651 B2
(45) Date of Patent: Dec. 6, 2016

(54) DELTA-SIGMA MODULATOR

(71) Applicant: KAPIK INC., Toronto (CA)

(72) Inventors: Syed Imran Ahmed, Toronto (CA);
James Andrew Cherry, Toronto (CA);
William Martin Snelgrove, Toronto (CA)

(73) Assignee: KAPIK INC., Toronto (CA)

( * ) Notice: Subject to any disclaimer, the term of this patent is extended or adjusted under 35 U.S.C. 154(b) by 0 days.

(21) Appl. No.: 14/838,918

(22) Filed: Aug. 28, 2015

(65) Prior Publication Data
US 2016/0065236 A1 Mar. 3, 2016

Related U.S. Application Data

(60) Provisional application No. 62/043,752, filed on Aug. 29, 2014.

(51) Int. Cl.
| | |
|---|---|
| *H03M 3/00* | (2006.01) |
| *G05F 3/02* | (2006.01) |
| *H03M 1/00* | (2006.01) |
| *H03M 1/12* | (2006.01) |

(52) U.S. Cl.
CPC ............... *G05F 3/02* (2013.01); *H03M 3/37* (2013.01); *H03M 3/386* (2013.01); *H03M 3/44* (2013.01); *H03M 1/00* (2013.01); *H03M 1/12* (2013.01); *H03M 3/30* (2013.01); *H03M 3/414* (2013.01); *H03M 3/45* (2013.01); *H03M 3/46* (2013.01)

(58) Field of Classification Search
CPC ............. H03M 3/30; H03M 1/12; H03M 1/00
USPC .................................. 341/143, 155, 120, 156
See application file for complete search history.

(56) References Cited

U.S. PATENT DOCUMENTS

| | | | | |
|---|---|---|---|---|
| 4,540,952 A | * | 9/1985 | Williams | H03F 1/083 330/279 |
| 8,797,200 B2 | * | 8/2014 | Goulier | H03M 3/346 341/143 |
| 2007/0204695 A1 | * | 9/2007 | Gross | A61B 5/121 73/585 |
| 2010/0097258 A1 | * | 4/2010 | Koli | H03H 15/00 341/155 |

\* cited by examiner

*Primary Examiner* — Joseph Lauture
(74) *Attorney, Agent, or Firm* — Perry + Currier Inc.

(57) ABSTRACT

A system and method to achieve low power and/or low supply operation of a delta-sigma modulator by taking advantage of the inherent virtual ground of the delta-sigma loop to make the input to a low power integrator small and largely independent of the input signal. This results in improved linearity of the integrator and relaxed constraints on the supply for the first stage integrator. The architecture also enables direct access to the quantization error of the feedback loop and thus can be used to either/or: 1. Calibrate the modulator, 2. Achieve reduced quantization noise, 3. Stabilize the loop by compensating for excess loop delay. Low voltage common-mode-feedback is also achieved using the techniques described.

42 Claims, 14 Drawing Sheets

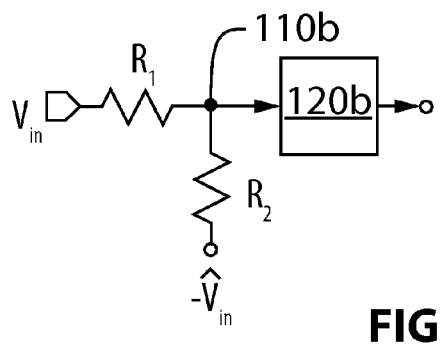
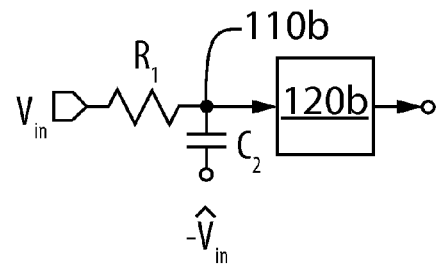
FIG. 15a　　　　　FIG. 15b
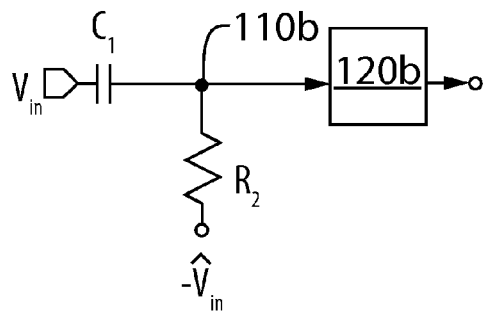
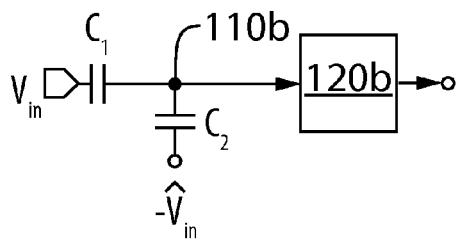
FIG. 15c　　　　　FIG. 15d
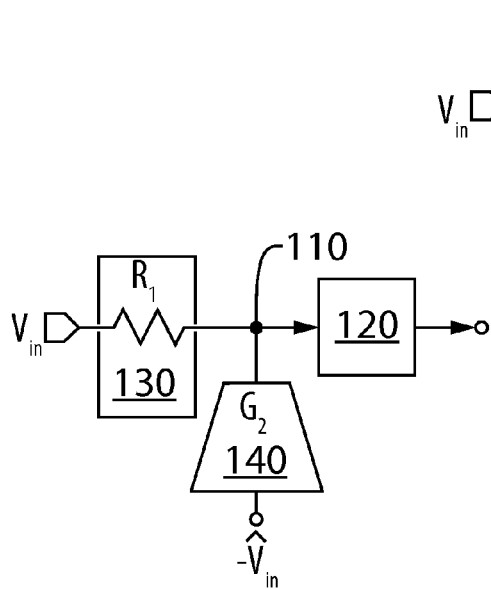
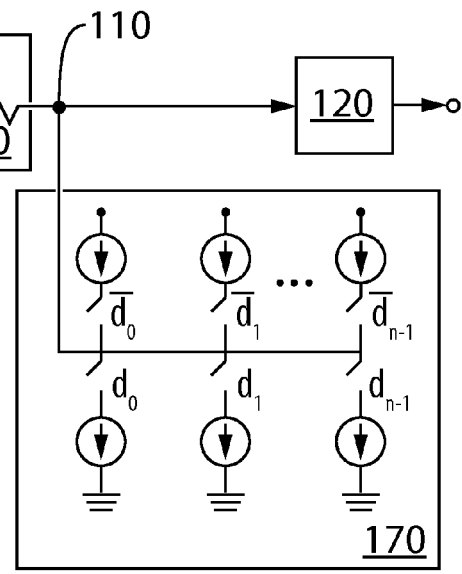
FIG. 16a　　　　　FIG. 16b

DELTA-SIGMA MODULATOR

FIELD OF THE INVENTION

The present invention relates to a delta-sigma (or sigma-delta) modulators, and in particular to architecture for achieving low power in delta-sigma (or sigma-delta) modulators.

BACKGROUND OF THE INVENTION

Low-power delta-sigma modulators are key building blocks in a variety of electronic systems, and especially those which require battery operation. Achieving low power generally requires a tradeoff between power and linearity.

A continuous-time delta-sigma architecture is commonly used to achieve low power. This style of architecture commonly uses either an active-RC integrator (FIG. 1) or Gm-C style of integrator (FIG. 2) to implement the loop transfer function.

Referring to FIG. 1, a known active-RC integrator 30 with an opamp 31 to drive resistive loads is shown. The active-RC integrator 30 achieves good linearity due to feedback from the output of the opamp 31 to its input which makes the input voltage at the opamp 31 very small. However, using feedback inside of the integrator requires additional bandwidth to drive impedances (e.g. possibly requiring a two-stage opamp) while keeping good phase-margin. Accordingly, additional power is required to drive the feedback network with sufficient loop gain and phase-margin to settle in a given amount of time.

Referring to FIG. 2, a Gm-C integrator 40 with a single stage is generally shown. A Gm cell 41 drives a capacitive load 42 without feedback from the output of the Gm cell 41 to its input and thus consumes less power than the active-RC integrator 30. In FIG. 2, the capacitive load 42 results in a voltage across the capacitor being an integral of the current applied to it. However, the Gm-C integrator 40 achieves poor linearity as a result of the large swing present at the input of the Gm cell 41. Furthermore, the supply voltage of the Gm cell 41 typically limits the maximum allowable swing at its input, restricting the utility of the Gm-C integrator 40.

Furthermore, in conventional continuous-time delta-sigma modulators, the delay through the quantizer and finite bandwidth through the integrators creates excess loop delay through the feedback loop which needs to be compensated for in order to maintain the stability of the closed loop response.

To implement the Gm cell 41 in a differential mode at low supply voltages a common-mode feedback circuit 185 is required is generally shown in FIG. 4. An example of a prior art method to establish the correct common-mode voltage setting ($V_{CMFB}$ in FIG. 18) is shown in FIG. 4. In FIGS. 4, M9 and M10 are designed to have the same $V_{DSAT}$ as MP1 and MP2. To minimize the noise contribution of MP1 and MP2, MP1 and MP2 generally should have a large $V_{DSAT}$. If the supply voltage of the Gm cell VDD however is low, the large $V_{DSAT}$ requirement can result in node 801 and/or 802 being so low that at least one of M3, M4, M5, or M6 enters the triode region thus significantly reducing the gain of the common-mode-feedback circuit of FIG. 4.

Referring to FIG. 3, a generic prior art continuous-time delta-sigma modulator is shown at 50. Typically excess loop delay is compensated by adding an additional digital-to-analog converter (DAC) 51 which feeds back a quantized signal from the output of the quantizer 52 to its input. As shown, the design of the extra DAC 51 facilitates the excess loop delay compensation and adds extra complexity and design time to the design of the modulator 50.

Referring to FIG. 5, an implementation of a prior art circuit to recursively use a delta-sigma modulation to improve the suppression of the quantization error, namely the MASH (Multi-stAge noise-SHaping) approach is shown generally at 600. In a MASH architecture the quantization noise is estimated by subtracting the input of the quantizer from an analog representation of its output using an additional DAC 601 and a circuit 603 to subtract the output of the additional DAC 601 from the quantizer input. The resultant error is an estimate of the quantization noise and is fed to a subsequent delta-sigma ADC 600, and the outputs from the ADCs combined through a DSP 602.

SUMMARY OF THE INVENTION

In accordance with an aspect of the invention, there is provided a delta-sigma modulator achieving low power by using an inherent virtual ground node to reduce the swing input to a low power integrator stage, such that the smaller input swing linearizes the integrator.

The virtual ground node of a delta-sigma modulator is different than typical feedback circuits as it is formed by subtracting a quantized version of the input rather than a continuously varying version of the input.

In accordance with another aspect of the invention, there is provided a delta-sigma modulator using the inherent virtual ground node to provide an advantage of having direct access to quantization error of the delta-sigma modulator which can be used as an additional degree of freedom to compensate for excess loop delay.

In accordance with another aspect of the invention, there is provided a delta-sigma modulator being able to access the quantization error of the modulator (either digitally or in analog) to maintain performance over mismatch, process variation, temperature, and/or supply.

In accordance with another aspect of the invention, there is provided a delta-sigma modulator digitizing the quantization error with another analog-to-digital converter (ADC) and combining it through a digital signal processor (DSP) with the output of the modulator to reduce the shaped quantization error in the output of the modulator. If the additional ADC is a delta-sigma modulator also, it is possible to recursively use the quantization error signal in the additional ADC(s).

In accordance with another aspect of the invention, there is a common-mode feedback circuit which enables operation of a Gm cell at low supply voltages.

BRIEF DESCRIPTION OF THE DRAWINGS

Reference will now be made, by way of example only, to the accompanying drawings in which:

FIGS. 15*a-d* are schematic representations of a portion of the delta-sigma modulator in accordance with various embodiments;

FIGS. 16*a-b* are schematic representations of a portion of the delta-sigma modulator in accordance with various embodiments;

DETAILED DESCRIPTION OF THE INVENTION

Figure 6:
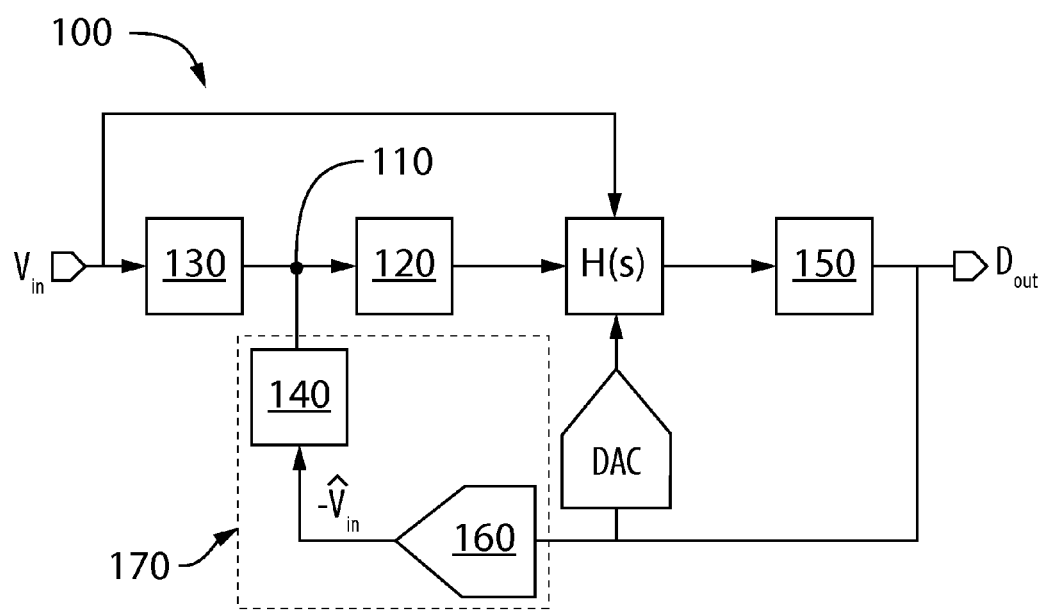
FIG. 6 is a schematic representation of a delta-sigma modulator in accordance with an embodiment.

Referring to FIG. 6, a delta-sigma modulator is shown generally at 100. The delta-sigma modulator 100 includes a virtual ground node 110 at the input of a first stage integrator 120.

In the present embodiment, the virtual ground node 110 in the delta-sigma modulator 100 consists of the input of the modulator 100 being subtracted from a quantized version of the input through a first two port network device 130 and a feedback DAC 170. In the present embodiment, the two port network device 130 is generally configured to for receive the input of the modulator 100 to output a modified analog signal. The feedback DAC 170 includes a voltage-in, voltage-out DAC 160 followed by a two port network device 140. In the present embodiment, the feedback DAC 170 is generally configured to receive a digital input signal and output an analog signal that combines with the analog signal from the two port network device 130 to form an integrator input voltage. Although the feedback DAC 170 can be implemented without generating the output of the voltage-out DAC 160 explicitly, the construct of the feedback DAC 170 captures the fact that the feedback DAC 170 can generate current, voltage, or charge as its output by changing the implementation of the two port network device 140. It is to be appreciated by a person of skill in the art with the benefit of this description that modifications to the present embodiment are possible. For example, although the embodiment shown in FIG. 6 is a single ended circuit, it can be modified to be a differential version of the circuit.

It should be noted that while the virtual ground node 110 is formed through negative feedback, since the virtual ground is produced by subtracting a continuously varying input from a quantized version of the input, a standard analysis of linear feedback generally would not directly apply to the virtual ground node 110.

It is to be appreciated, that if the two port network device 130 and the two port network device 140 are implemented, for example, with an equal impedance, the voltage at the virtual ground node 110 will be given by the difference of the input voltage and the quantized version of the input (from the feedback DAC). This thus leaves a residual voltage at the virtual ground node 110 which is bound within half a least significant bit (LSB) of the feedback DAC 170.

It is to be appreciated with the benefit of this description that the two port network devices 130 and 140 shown in FIG. 6 are not particularly limited. For example, the two port network devices 130 and 140 can be modified to be implemented as a transimpedance. In such a case the voltage at the input of the first stage integrator is the product of the current flowing through the virtual ground node 110 and the equivalent impedance at the virtual ground node 110.

Figure 1:
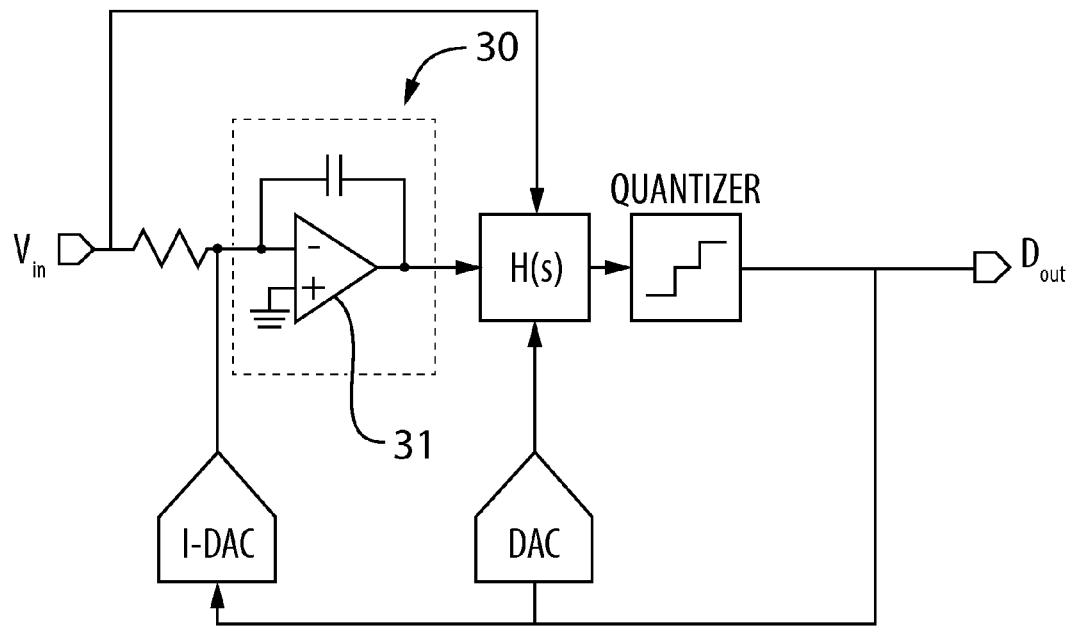
FIG. 1 is a schematic representation of a conventional active RC integrator.

In addition, it is to be appreciated that in the present embodiment, the integrator 120 generates a scaled integral of the input voltage received at the modulator 100. That is the input of the integrator 120 in FIG. 6 is a voltage which is in contrast to conventional integrators receiving input that is generally a current. In contrast, conventional integrators (such as an active-RC shown in FIG. 1, or the Gm-C shown in FIG. 2) receive a current input and generates a voltage output which is an integral of its input current.

Figure 11:
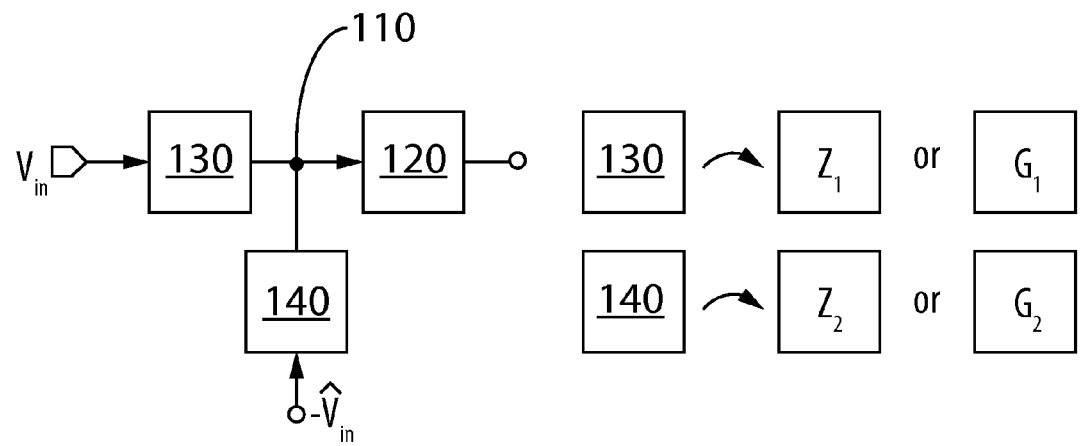
FIG. 11 is a schematic representation of a portion of the delta-sigma modulator and two port network devices in accordance with an embodiment.

The input of the modulator 100 and/or quantized version of the input can be subtracted from each other in any combination of voltage or current. Furthermore, it is to be appreciated that the two port network device 130 and the two port network device 140 in FIG. 6 can be implemented as impedances or transimpedances, or any combination of impedances and/or transimpedances as shown in FIG. 11.

Since the input to the first stage integrator 120 is a voltage, the voltage at the input of the first stage integrator 120 according to Ohm's law will be the product of the current flowing through the virtual ground node 110 and the impedance at the virtual ground node 110.

Figure 7:
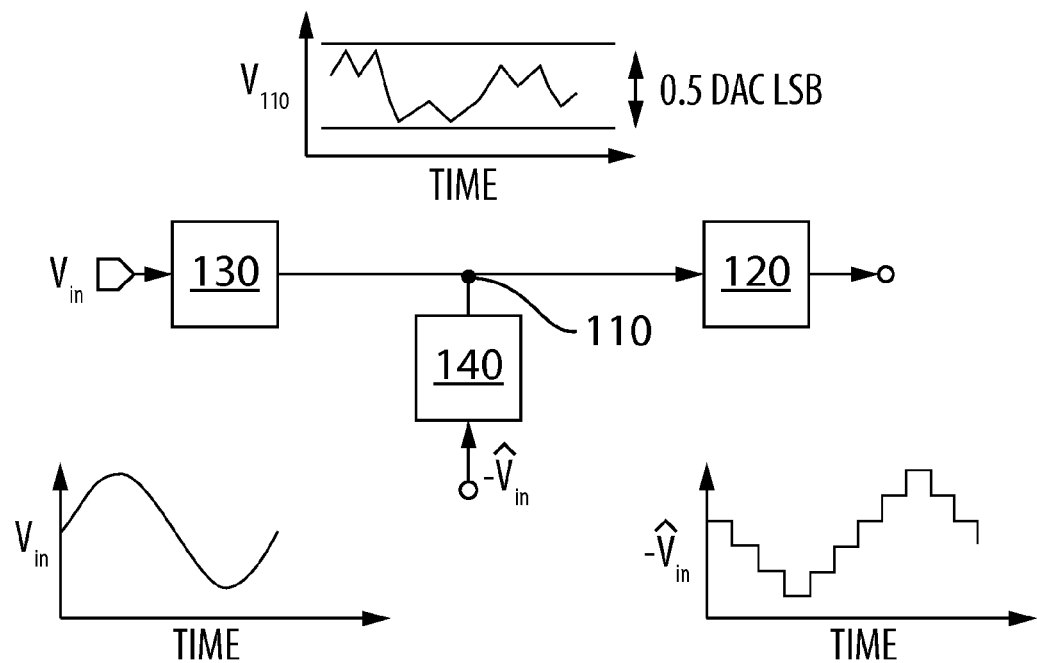
FIG. 7 is a schematic representation of a portion of the delta-sigma modulator in accordance with the embodiment of FIG. 6 showing voltage profiles at different nodes.

Referring to FIG. 7, when the input varies by a certain voltage the feedback DAC 170 counters the change in input voltage and produces a quantized version of the input to subtract from the input, leaving a residual voltage at the virtual ground node 110 of the delta-sigma modulator 100 which contains a substantially attenuated (relative to the input of the modulator) component of the input signal. It is to be appreciated that the residual voltage limits are not particularly limited and can be varied. For example, in the present embodiment, residual voltage at the virtual ground node 110 can bound within 0.5 LSB of the feedback DAC 170. However, other embodiments can have narrower or wider bounds. It is to be appreciated by a person of skill in the art that the swing at the virtual ground node 110 can be further reduced by increasing the number of bits in a quantizer, such as N-bit quantizer 150, and feedback DAC 170 as shown in FIG. 7. In the present embodiment, the non-linearity produced by the input stage of the integrator 120 in FIG. 6 is proportional to its input signal swing—larger input swings result in larger non-linearity and smaller swings results in smaller non-linearity. By using the inherent virtual ground of the delta-sigma modulator 100 to make the swing at the first stage integrator 120 input smaller, the linearity of the integrator 120 is hence improved by virtue of the smaller swing.

It is to be appreciated by a person of skill in the art with the benefit of this description that variations are contemplated. For example, although the present embodiment receives an input voltage, it is to be understood that the delta-sigma modulator 100 can be modified to receive any input analog signal. For example, other types of analog input signals can include a current, a charge, or an optical signal.

Furthermore, since the virtual ground node 110 is the result of the input being subtracted from a quantized version of the input, the virtual ground node 110 becomes less and less correlated with the input as the number of bits in a quantizer 150 and the voltage-in, voltage-out DAC 160 increase. As a result the virtual ground node 110 is largely independent of the input signal. Hence any non-linearity produced by the first stage integrator 120 weakly refers to the input of the modulator 100.

Low power in the modulator is thus achieved by using the inherent virtual ground 110 of the modulator 100 to linearize an integrator which has low power as a result high non-linearity. Since the first stage integrator 120 can consume a significant amount of power in the delta-sigma modulator 100, by relaxing its linearity requirements (which directly map to increased power), a substantial amount of power savings in the modulator 100 can be achieved.

Accordingly, with this technique an integrator topology such as Gm-C, which achieves low power but normally poor linearity can be made to provide good linearity by virtue of the smaller input swing and maintain its low power property.

Figure 8:
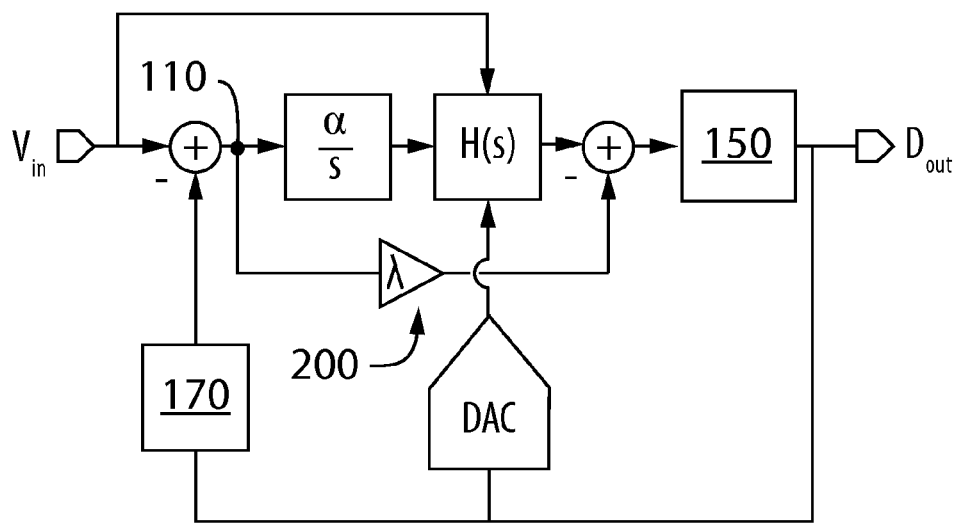
FIG. 8 is a schematic representation of a delta-sigma modulator in accordance with another embodiment having excess loop delay compensation.

It is to be appreciated by a person of skill in the art with the benefit of this description that an advantage of the architecture of the modulator is that an excess loop delay compensation path 200 can be realized by feeding the virtual ground node 110 of the delta-sigma modulator 100 (appropriately scaled) to the input of a N-bit quantizer 150 as shown in FIG. 8.

Accordingly, it is to be appreciated that one advantage of the present embodiment is that compensation is achieved in this work over methods used in prior art where the virtual ground node is typically only available as a current and thus cannot be easily fed forward to the quantizer input.

Figure 9:
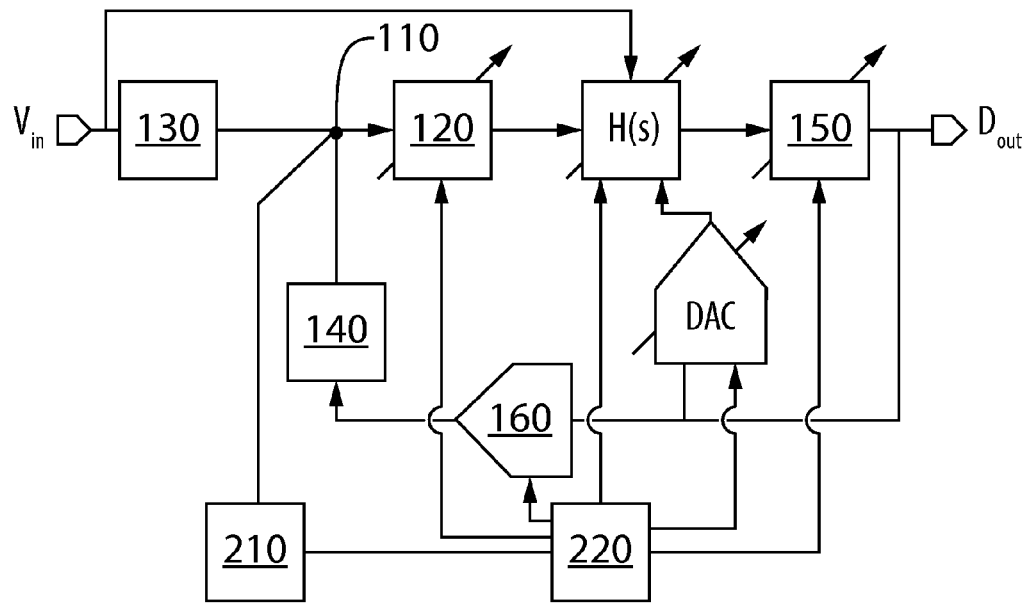
FIG. 9 is a schematic representation of a delta-sigma modulator in accordance with another embodiment.

It is to be appreciated by a person of skill in the art with the benefit of this description that an advantage is that since the quantization error signal is largely independent of the input signal, the quantization error signal can be monitored to detect non-idealities in the modulator which can then subsequently be calibrated or compensated for either in the analog or digital domain as shown in FIG. 9.

From FIG. 9, the monitor 210 (eg. ADC) and function 220 (eg. DSP) can be implemented in the analog and/or digital domains. For example, the monitor 210 can be implemented as an ADC and the function 220 can be implemented as a DSP which is used to adapt/modify various parameters in the modulator.

Figure 10:
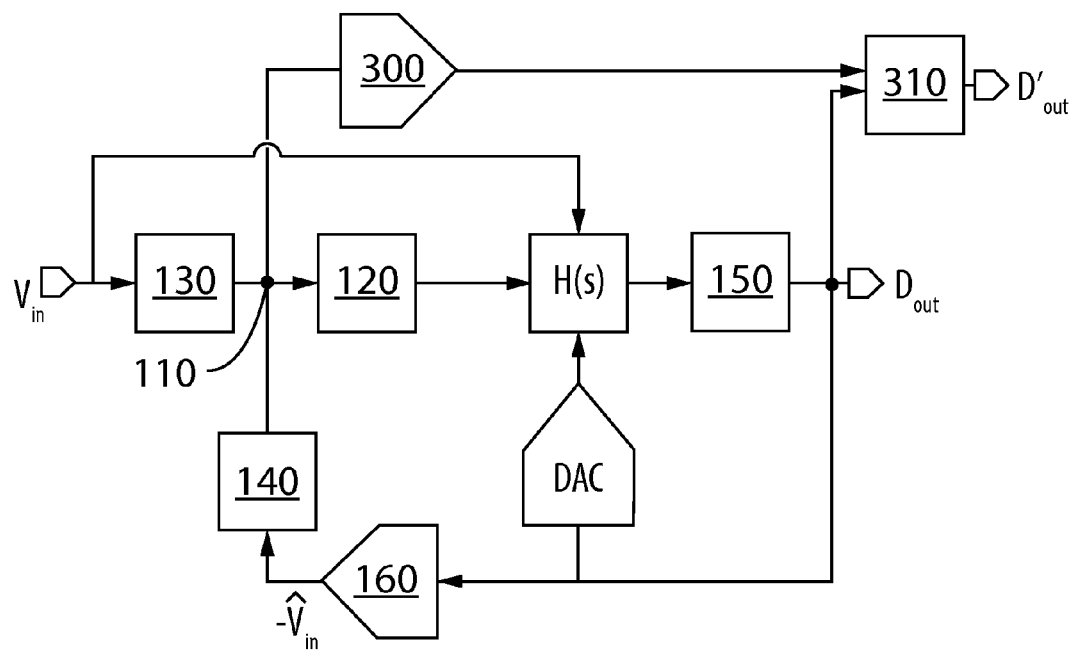
FIG. 10 is a schematic representation of a delta-sigma modulator in accordance with another embodiment having an ADC to acquire information.

According to another embodiment of the modulator, if the quantization error signal is digitized through ADC 300 it is possible to use the information in that signal and combine it with the output of the modulator ($D_{out}$) to produce a signal $D'_{out}$ which has reduced quantization noise as shown in FIG. 10.

Figure 12:
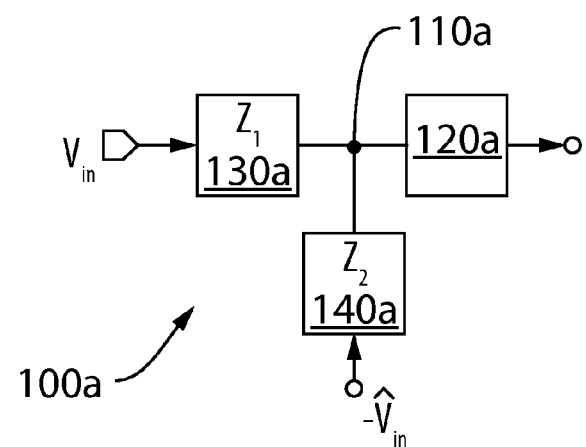
FIG. 12 is a schematic representation of a portion of the delta-sigma modulator in accordance with another embodiment.

Referring to FIG. 12, an embodiment showing the two port network devices 130a and 140a being impedances is generally shown at 100a. The virtual ground node 110a is effectively produced by a voltage divider effect in which the virtual ground node 110a is generated between two impedances, where one terminal is connected to the input and the other end of the second impedance to effectively a quantized version of the input, yielding the residual difference of the two between the two impedances appearing at the input of the integrator.

It is to be appreciated by a person of skill in the art that when the two port network devices 130a and 140a have equal impedances, the virtual ground node 110a is bound within 0.5 LSB of the feedback DAC, however different bounds as well as different compositions of the signal at the virtual ground node 110a can be generated by changing the value of the impedance of the two port network device 140a (Z2) relative to the impedance of the two port network device 130a (Z1) in FIG. 12.

Figure 13:
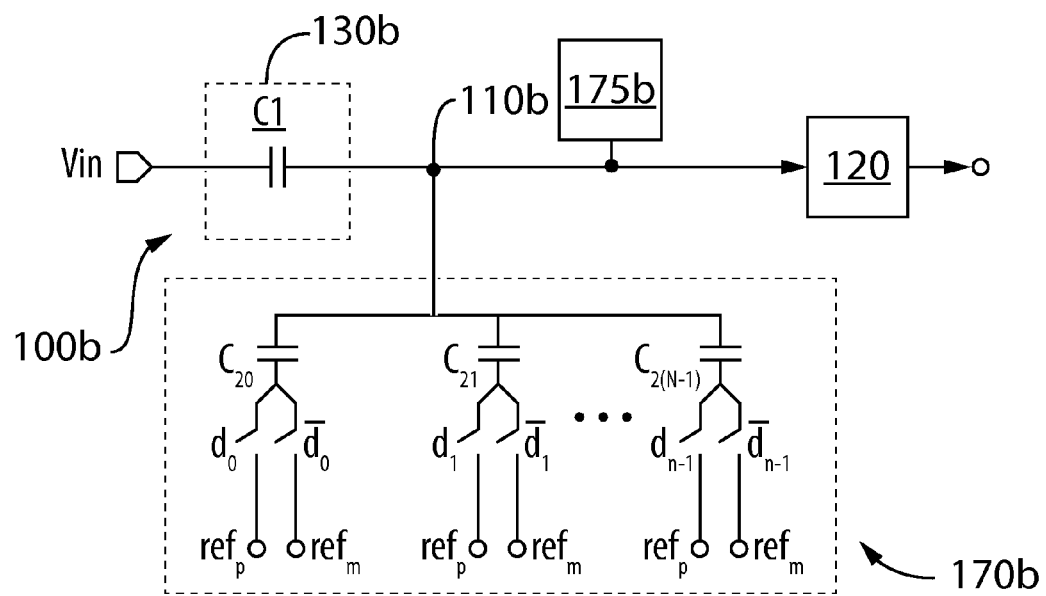
FIG. 13 is a schematic representation of a portion of the delta-sigma modulator in accordance with another embodiment.
Figure 14A:
FIGS. 14*a-c* are schematic representations of DC bias in accordance with various embodiments.
Figure 14B:
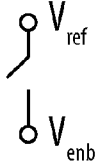
Figure 14C:
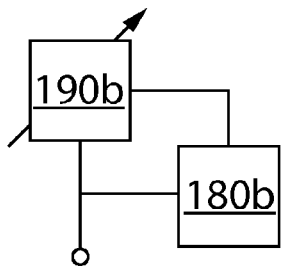

Referring to FIG. 13, another embodiment is generally shown at 100b. In the present embodiment, the two port network device 130b and the feedback DAC 170b include capacitors as shown in FIG. 13. In the present embodiment, the the feedback DAC 170b combines a voltage-in, voltage-out DAC and the two port network device (as an impedance) in a single circuit. In addition, a DC biaser 175b is provided to bias the virtual ground node 110b. It is to be appreciated that the DC biaser 175b is not particularly limited. For example, the DC biaser 175b can bias of the virtual ground node 110b using a resistor (FIG. 14a), a switch which is periodically switched to establish the DC behavior of the virtual ground (FIG. 14b), or a feedback circuit which measures and establishes in feedback a desired DC voltage (FIG. 14c). In FIG. 14c, a measurement device 180b measures the difference between the desired bias voltage and target bias voltage and device 190b establishes the bias voltage. For example, 180b could be an opamp or ADC which measures the DC voltage at 110b and 190b could be a tuneable current source such as a MOSFET which reacts to 180b such that the DC value of 110b is established to a known value.

It is to be appreciated that the two port network devices 130b and 140b are not particularly limited and that variations are contemplated. For example, various combinations of resistors and capacitors can be used with a suitable impact on the transfer function seen at the virtual ground node 110b as shown in FIGS. 15a, 15b, 15c, and 15d.

Referring back to FIG. 6, the two port network devices 130 and 140 can be implemented as any combination of impedances and transimpedances as previously discussed. For example, the input could be fed in to the virtual ground node 110 through a resistor and/or the DAC operation performed in the current domain at the virtual ground node 110 as shown in FIGS. 16a and 16b (i.e. the DAC produces a quantized current based on an input feedback voltage). In the variation shown in FIG. 16b, the swing at the virtual ground node 110 is given by the product of the impedance at the virtual ground node 110 and the LSB size of the current-mode DAC. In the present embodiment, the two port network device 130 is implemented as a resistor and the two port network device 140 is implemented as a transimpedance. Furthermore, the two port network device 140 and the voltage-in, voltage-out DAC 160 are combined into the feedback DAC 170 as a current mode DAC. Since the output of integrator 120 is the integral of the voltage at the virtual ground node 110 the swing at the input of the integrator 120 is the product of the current flowing through the virtual ground node 110 and the impedance at the node.

Figure 17:
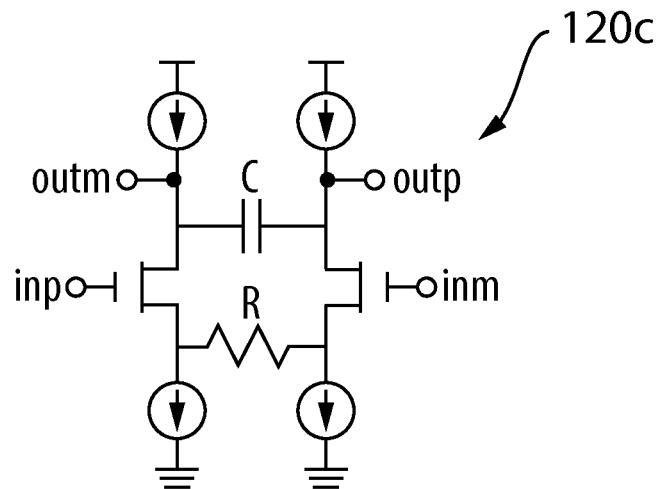
FIG. 17 is a schematic representation of a first stage integrator in accordance with an embodiment.

Referring to FIG. 17, an embodiment of the first stage integrator 120 is implemented as a Gm-C stage. It is to be appreciated that the first stage integrator 120 is not particularly limited. For example, FIG. 17 illustrates an n-channel metal-oxide-semiconductor field-effect transistor (NMOS) version of the circuit. However, the first stage integrator 120 can be modified to be a p-channel metal-oxide-semiconductor field-effect transistor (PMOS) version. As another example of a variation, although the present embodiment uses a differential circuit, the circuit can be modified to be a single ended circuit.

Figure 2:
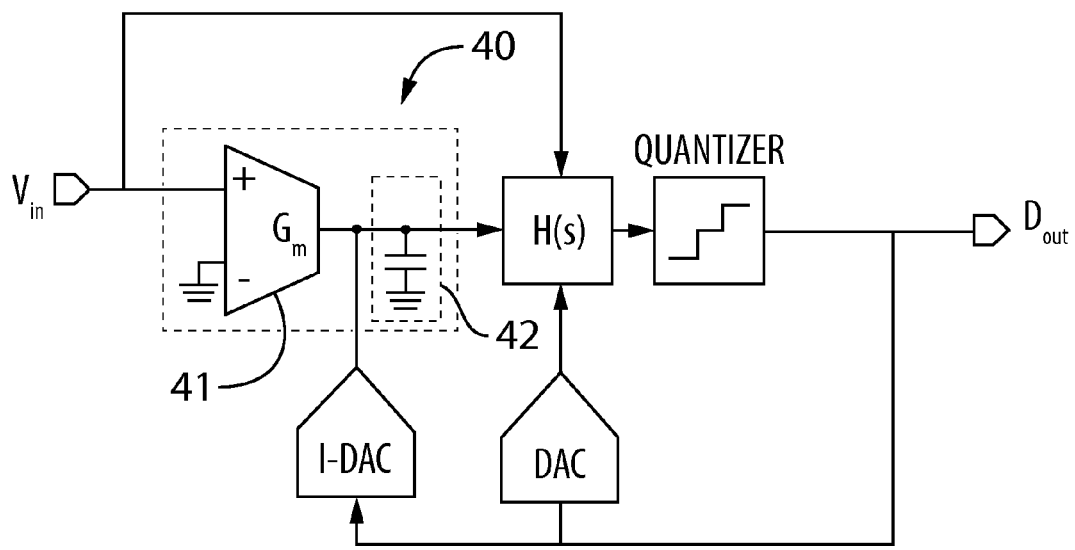
FIG. 2 is a schematic representation of a conventional active GM-C integrator.

Continuing with the example of FIG. 17, by virtue of the small signal produced at the input of the Gm stage of the first stage integrator 120 using the architecture of this work shown in FIG. 6, the Gm cell has its linearity improved significantly relative to configurations where the input signal to the modulator directly drives the input of a Gm cell, such as shown in FIG. 2. In the prior art of FIG. 2 since the input swing to the modulator can be large, the non-linearity produced by the Gm cell will also be large in the prior art.

In addition to the smaller signal improving the linearity, since the signal content of the input of the Gm stage of the first stage integrator 120 has a large amount of the input signal to the modulator subtracted from it, the input to the Gm cell of the first stage integrator 120 is weakly dependent on the input to the modulator thus further improving the linearity response of the of the first stage integrator 120. In particular, the input of the first stage integrator 120 and thus its output is not strongly dependent on the input to the modulator, thus the non-linearities in the Gm cell do not produce a large input causing a non-linear response.

Figure 18:
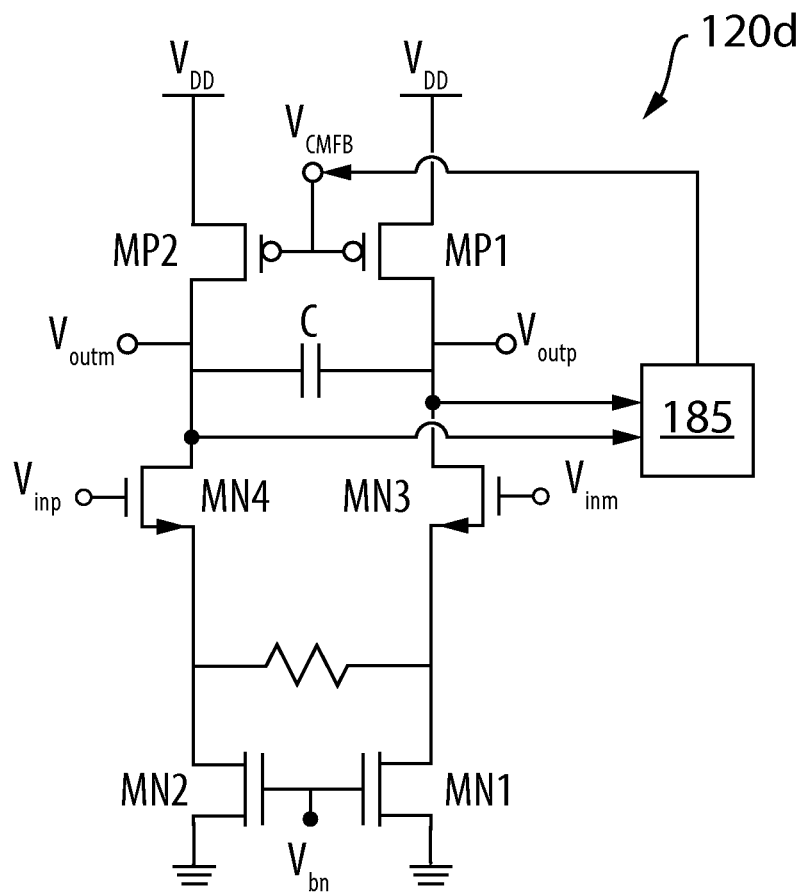
FIG. 18 is a schematic representation of a GM cell in accordance with an embodiment.

Referring to FIG. 18, another embodiment of a Gm cell is generally shown at 120d. It is to be appreciated that since the input connected to terminals MN3 and MN4 essentially buffer the input to the Gm cell 120d to their source nodes, the input signal of the Gm cell 120d appears almost fully at the source terminals of MN3 and MN4 and as a result the minimum output swing of the Gm cell 120d is limited by the swing at the input of the Gm cell 120d. Referring to FIG. 18, it is to be appreciated by a person of skill in the art with the benefit of this description that the swing at $V_{outp}$ has a maximum value of $V_{DD}$-$V_{DSAT\_MP1}$ and a minimum value of $V_{inm}$-$V_{th\_MN3}$+$V_{DSAT\_MN3}$.

The available signal at the output of the Gm cell is reduced by the swing at the input of the Gm cell. In the approach of FIG. 2, the input to the Gm cell is the input signal to the modulator (which can be very large), thus if the supply voltage is low, the output swing of the Gm cell is severely limited.

Figure 19:
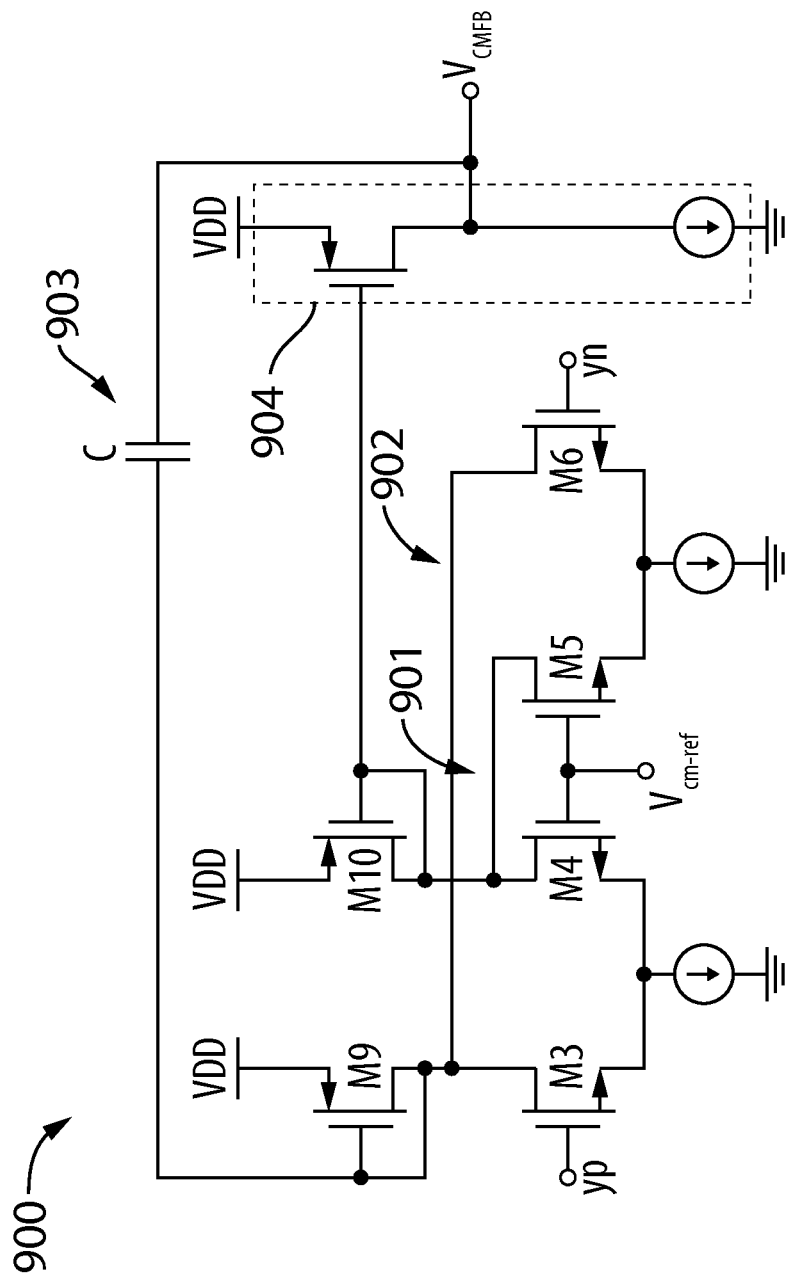
FIG. 19 is a schematic representation of a common-mode feedback circuit in accordance with an embodiment.

In FIG. 18, a common-mode-feedback circuit 185 measures the common-mode voltage at the output of the Gm cell 120d and establishes the correct common-mode voltage $V_{CMFB}$ to achieve the desired output common-mode voltage. It is to be appreciated by a person of skill in the art with the benefit of this description that there are several ways to implement a common-mode feedback circuit. A particular example of a common-mode-feedback circuit 185 is as shown in FIG. 19 and discussed below in greater detail.

It is to be appreciated with the benefit of this description, that the linearization technique of provided by the modulator 100 provides an input signal swing to the Gm that is smaller relative to the Gm-C style architectures such as those illustrated in of FIG. 2. Accordingly, there is more voltage swing available to the output of the Gm cell enabling a combination of larger output swings and/or a lower supply voltage than the approach of FIG. 2.

In the context of the architecture embodiment shown in FIG. 6 the virtual ground node 110 is also the quantization error of the delta-sigma modulator, which is the difference between the input and the quantized version of the input fed back through the feedback DAC 160.

Figure 20:
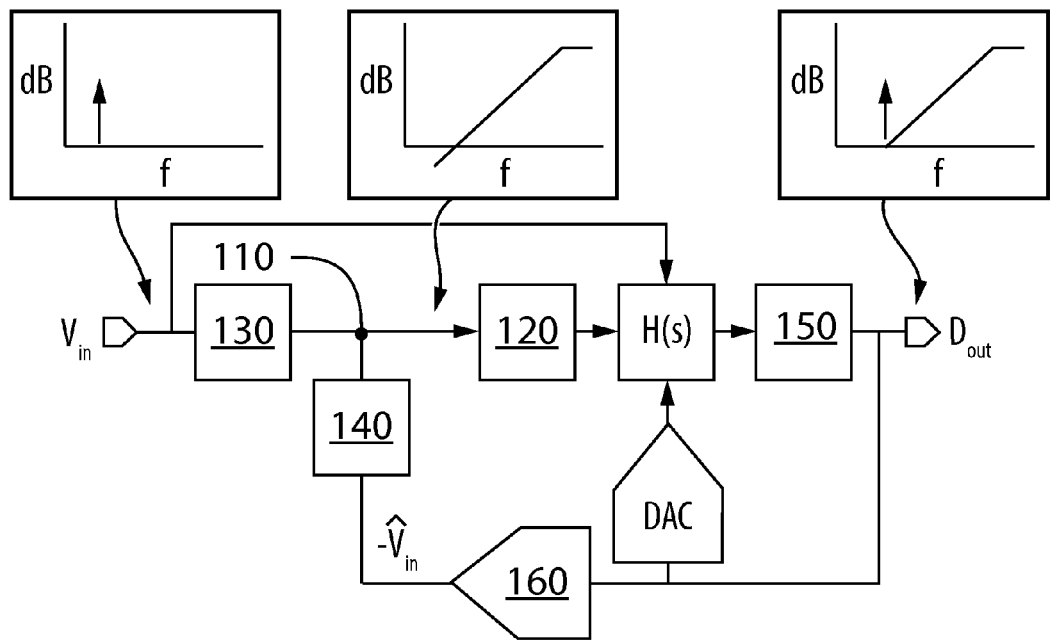
FIG. 20 is a schematic representation of a portion of a delta-sigma modulator in accordance with an embodiment showing spectrums at different nodes.

Referring to FIG. 20, the spectrums of various key nodes in the architecture is shown. It is noted that the spectrum of the virtual ground/quantization error signal is primarily that of the noise transfer function of the loop. That is, the shaped quantization error can be seen without a significant contribution of the input.

This node can be used to extract signals and/or statistics of the quantization error of the loop to adapt various parameters of the modulator. This could be done by looking at the quantization error through an ADC 300 upon which the output of the ADC 300 can have certain digital algorithms applied thereupon to produce settings which can modify the behavior of the modulator as shown in FIG. 9.

This could be done by e.g. looking at the quantization error through an ADC upon which the ADC's output can have certain digital algorithms applied to thereupon produce settings which can modify the behavior of the modulator as shown in FIG. 9.

For example, by using a digital algorithm to look at the digitized quantization error, the shape of the noise transfer function (NTF) can be monitored to detect changes in its shape due to temperature, supply, process, and/or mismatch for example, and there upon modify parameters in the modulator to maintain a fixed transfer function and/or ensure loop stability.

Figure 21:
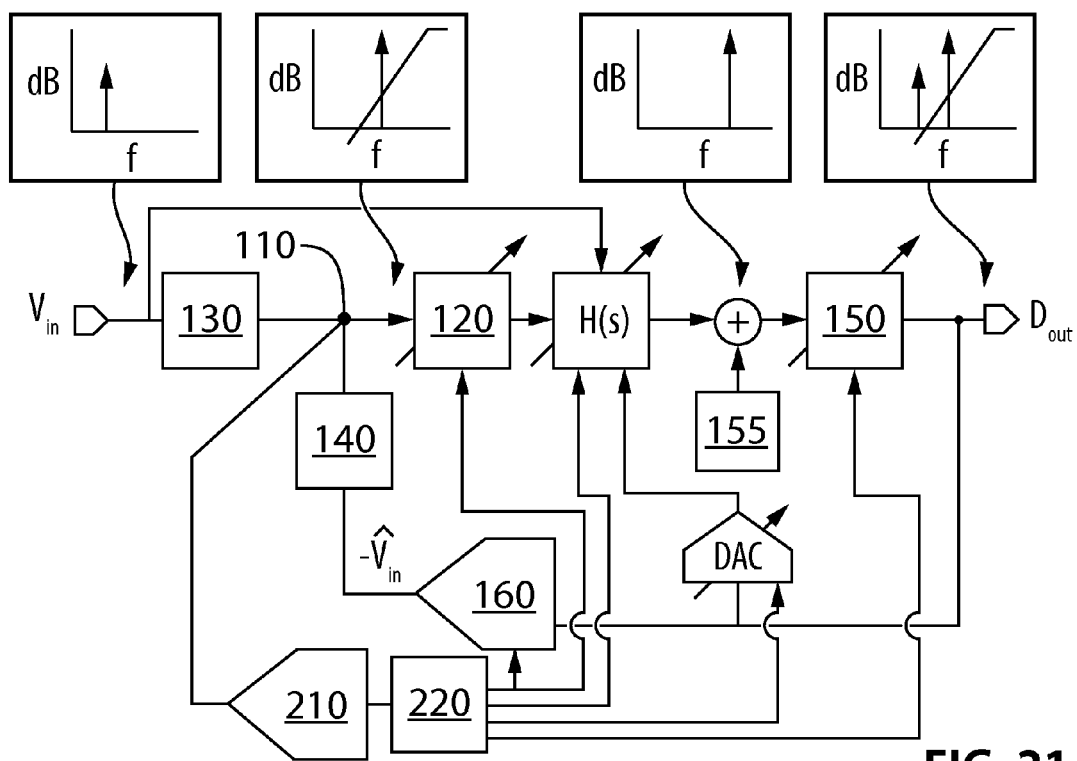
FIG. 21 is a schematic representation of a portion of a delta-sigma modulator in accordance with an embodiment showing a test calibration signal.

Another example would be to inject a test calibration signal into the modulator just before the quantizer 150 using a signal generator 155 as shown in FIG. 21. In the presence of non-ideality in the modulator the calibration signal in FIG. 21 will be affected by the non-ideality. Since the quantization error signal at the virtual ground node 110 in FIG. 20 contains an attenuated version of the input signal of the modulator 100, the test calibration signal and how it has been affected by the non-idealities in the loop can be easily detected without having to also process much of the input signal itself.

The input signal is generally much larger than the test calibration signal so by having it attenuated from the signal which is used to determine the non-ideality in the loop, calibration can be performed much faster and more accurately as the input does not interfere in determining the non-ideality of the loop.

Referring back to FIG. 9, the modulator can have any of its parameters adjusted based on the quantization error. The various transfer functions through the stages in the modulator can be compensated for temperature, supply, or process variation, for example.

Since the virtual ground node 110 in FIG. 10 is the quantization error of the modulator it is also possible to digitize the quantization error through an ADC 300 and then perform an operation on the output of the modulator based on the digitized version of the quantization error using a DSP 310.

Figure 22:
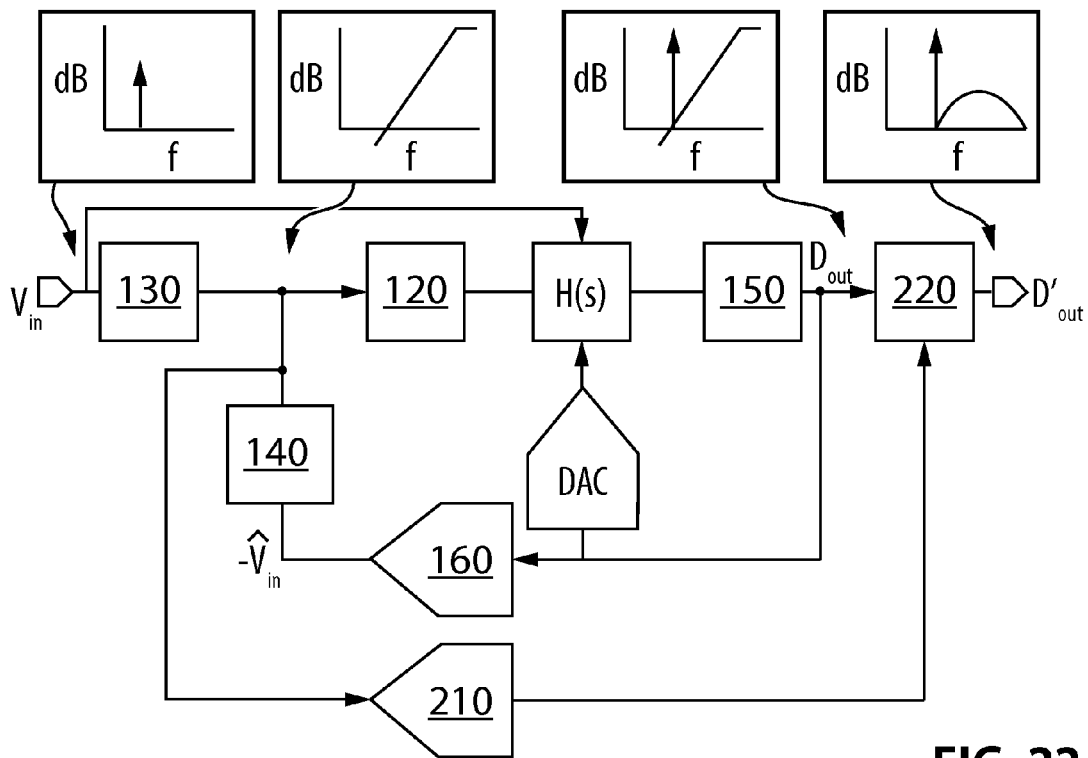
FIG. 22 is a schematic representation of a portion of a delta-sigma modulator in accordance with an embodiment showing a measurement of quantization noise.

FIG. 22 shows the Fast Fourier Transform (FFT) spectrum of modulator and the quantization error. Since the digitized output of the quantization error has predominantly the spectrum of the shaped quantization noise of the modulator it is thus possible to reduce the content of the quantization error in the modulator output by performing a DSP operation on the modulator output as a function of the digitized quantization error.

The reduction of the quantization error could, for example, be used to relax the requirements of a cascaded integrator-comb (CIC) filter which is used to process the output of the modulator.

By reducing the effect of the shaped quantization error it is possible to further increase the effective bandwidth of the modulator as the quantization noise becomes reduced in output of the DSP.

Figure 23:
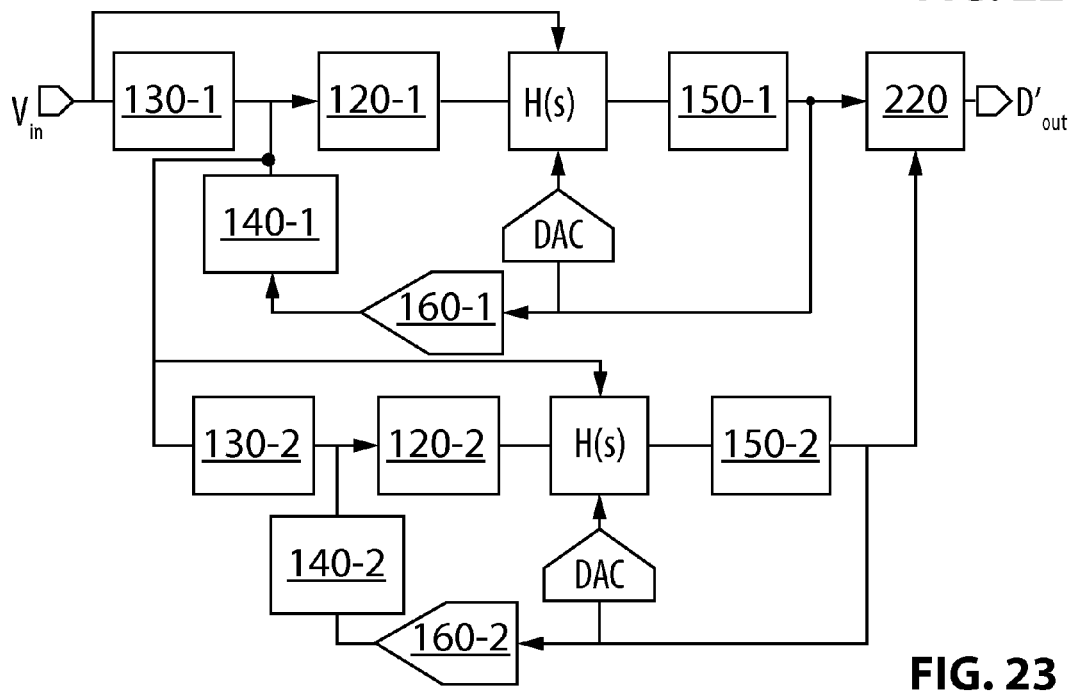
FIG. 23 is a schematic representation of a delta-sigma modulator in accordance with an embodiment recursively using the virtual ground node.

For example, if a suitably time shifted and filtered version of the digitized quantization error signal is subtracted from the modulator output, the resultant difference will have a reduced amount of quantization noise in the spectrum compared to the original output of the modulator The quantization error can be digitized by any type of ADC or even another delta-sigma modulator as shown in FIG. 23. In the present embodiment, the first modulator includes a first stage integrator 120-1, a first two port network device 130-1, a second two port network device 140-1, a quantizer 150-1, and a DAC 160-1. Similarly, the second modulator includes a first stage integrator 120-2, a first two port network device 130-2, a second two port network device 140-2, a quantizer 150-2, and a DAC 160-2. The quantizers 150-1 and 150-2 are connected to a DSP 220.

Figure 24:
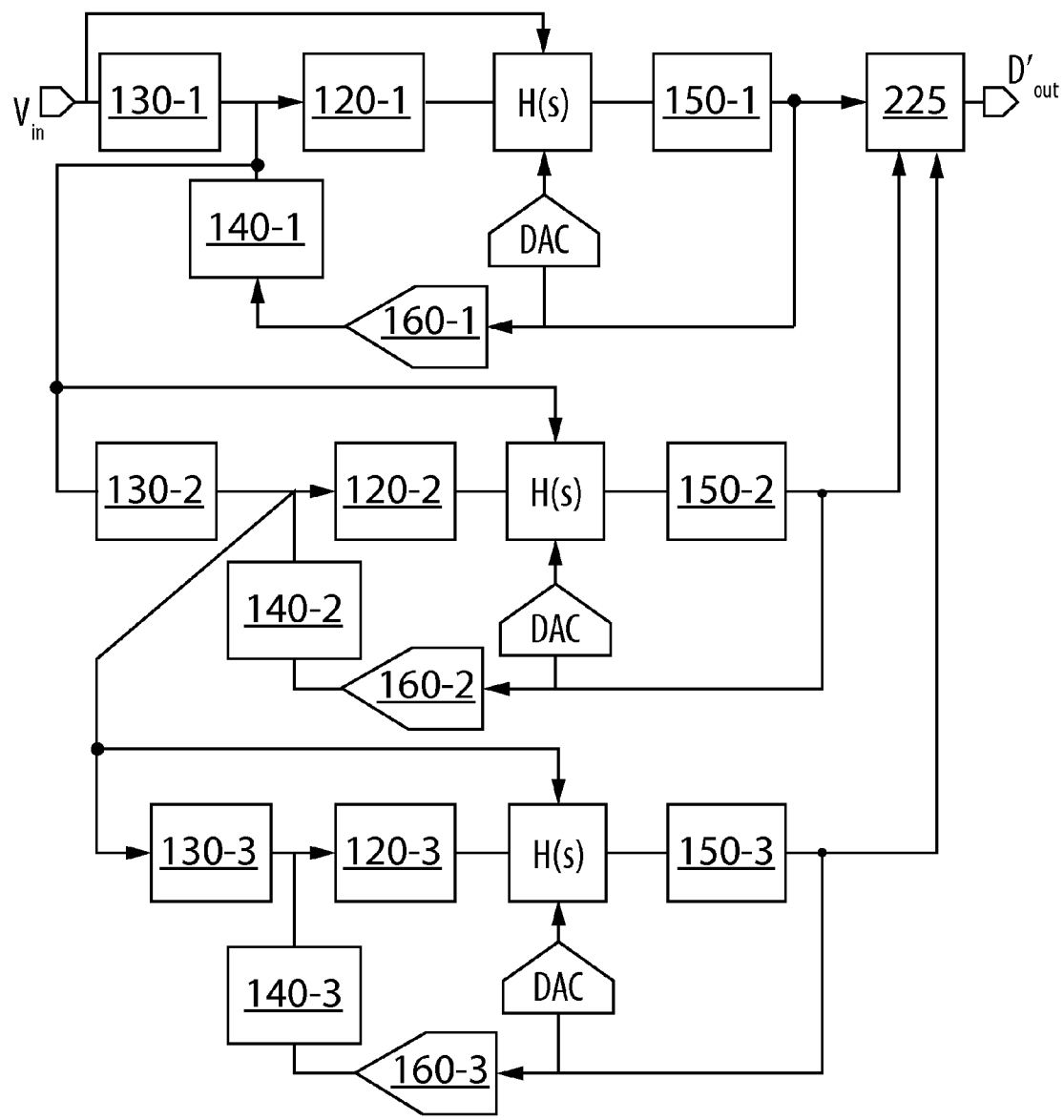
FIG. 24 is a schematic representation of a delta-sigma modulator in accordance with another embodiment recursively using the virtual ground node.

The concept of FIG. 23 can be applied recursively using the virtual ground in the ADC which measures the quantization noise to reduce quantization noise in the modulator to realize a higher order cancellation as shown in FIG. 24. In the present embodiment, the concept of FIG. 24 includes a third modulator having a first stage integrator 120-3, a first two port network device 130-3, a second two port network device 140-3, a quantizer 150-3, and a DAC 160-3. It is to be appreciated with the benefit of this description that further modulators can be added to achieve even higher order cancellation.

Figure 5:
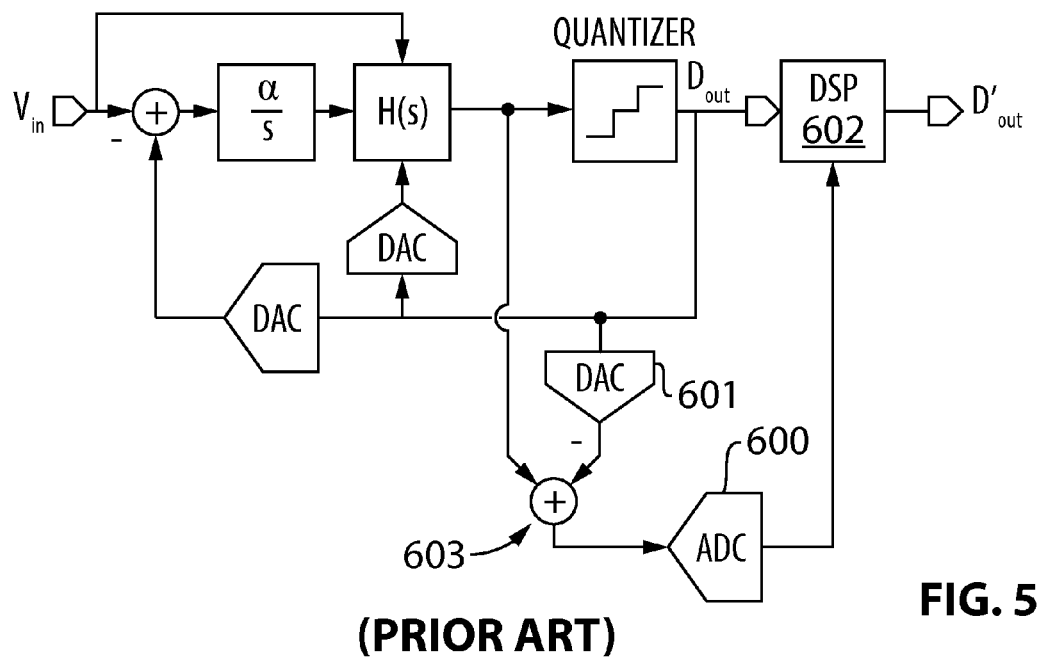
FIG. 5 is a schematic representation of a conventional circuit to recursively use a delta-sigma modulation in accordance with an embodiment.

It is to be appreciated by a person of skill in the art with the benefit of this description that the embodiments shown FIGS. 22-24 provide advantages over the prior art modulators, such as the one shown above in FIG. 5. As an example of an advantage, the additional DAC is no longer required. In addition, the additional circuit to subtract the DAC output from the quantizer input is also no longer required. Since the additional DAC and subtraction circuit can have gain and mismatch errors, by using the DAC and subtraction blocks inside of the existing delta-sigma loop of the embodiment illustrated in FIG. 22 to measure the quantization error can be more accurate and does not require the additional power and physical space for an the additional DAC and subtraction circuit.

Figure 3:
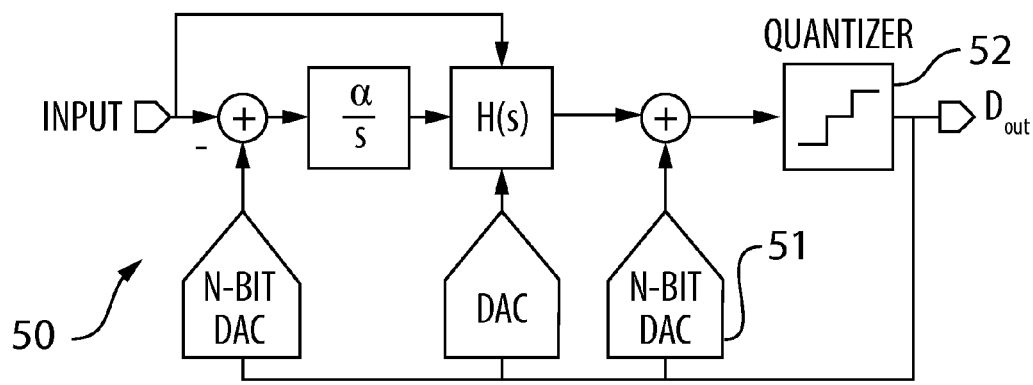
FIG. 3 is a schematic representation of a conventional modulator having excess loop delay compensation.
Figure 4:
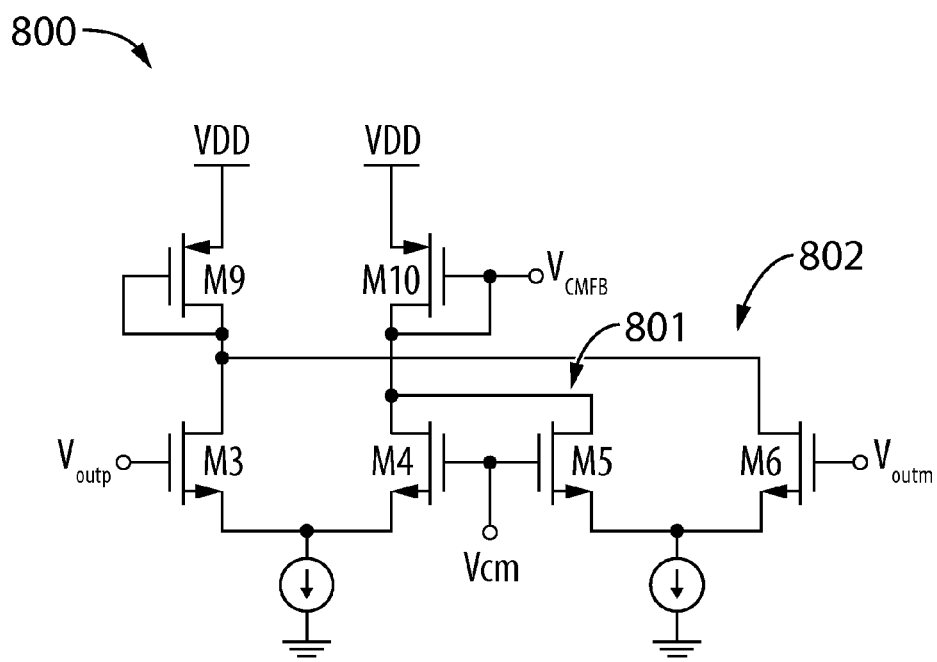
FIG. 4 is a schematic representation of a conventional common-mode feedback circuit in accordance with an embodiment.

An additional advantage of having access to the quantization error is that it can be used to create an additional degree of freedom to compensate for excess loop delay in a continuous-time modulator. It is to be appreciated that this reduces the need for using a feedback DAC from the quantizer output such as shown in FIG. 3 which creates an extra degree of freedom to compensate the loop and requires the design and verification of an additional DAC.

Figure 25:
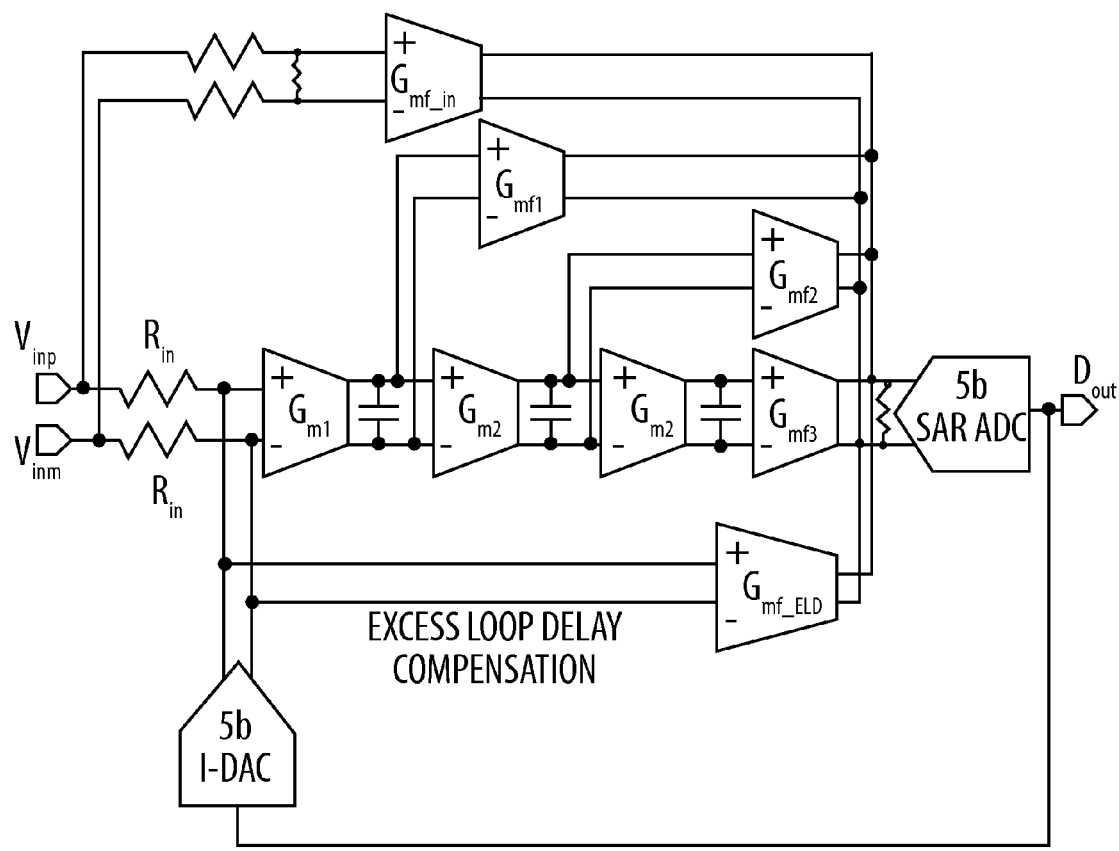
FIG. 25 is a schematic representation of a delta-sigma modulator in accordance with another embodiment.

Referring the FIG. 25, another example of a way to achieve the compensation is to feed forward the quantization error through a Gm cell. By using such a scheme, the excess loop delay of the continuous time modulator can be compensated without the use of an explicit feedback DAC.

In the embodiment shown in FIG. 25, an example of a modulator is shown. The modulator uses the inherent virtual ground of the modulator to achieve low power and use the quantization error as an additional term for compensating the excess loop delay.

FIG. 19 shows an embodiment which shows an alternative method to build a common-mode-feedback circuit 185. In FIG. 19 a second gain stage 904 is added. The second gain stage 904 allows the $V_{DSAT}$ of M9 and M10 to not be the same $V_{DSAT}$ of MP1 and MP2 in FIG. 18, and thus the $V_{DSAT}$ of M11 and M12 can be made much smaller than M9 and M10. As a result nodes 901 and 902 are high enough to keep M3, M4, M5, and M6 in the active region for low values of $V_{DD}$. Hence the gain of the common-mode-feedback-circuit is maintained at lower supply voltages.

It is to be appreciated that two stages of gain in the common-mode-feedback circuit 185 is provided and results in a feed forward path 903 which reduces the two stages of gain to effectively one stage at higher frequencies. As a result the feed-forward path of 903 provides a zero which helps to improve the loop stability of the common-mode-feedback loop. Thus with the embodiment shown in FIG. 19 provides good loop gain (by virtue of there being two stages), good noise (by virtue of M11 and M12 being independent of MP1 and MP2), and good stability (by virtue of the zero in 903) can be achieved simultaneously. It is to be appreciated by a person of skill in the art with the benefit of this description that the design is not particularly limited. For example, although NMOS devices are shown, a similar design can be implemented with PMOS devices.

Furthermore, it is to be appreciated that variations are contemplated. For example, although the common-mode-feedback circuit 900 is shown here for a Gm cell, the common-mode-feedback circuit 900 can be used for any differential circuit requiring a common-mode-feedback circuit. For example 900 can be used in a differential opamp.

Various advantages will now be apparent to a person of skill in the art. Of note is that the inherent virtual ground node 110 can be used to make the input to the first stage integrator have a small signal swing and a signal content which is largely independent of the input signal swing. This allows the use of a low power and substantially non-linear integrators to be realized. For example, the first stage integrator could be implemented as a Gm cell. The smaller signal at the input of the Gm afforded by the feedback structure outlined above enables the Gm to have a more linear response due to its input being smaller and largely independent of input signal. The smaller input swing also enables the Gm cell to work at much lower supply voltages than would otherwise be possible if the input of the Gm cell had the complete input signal swing as is the case in the prior art.

In addition, another advantage of note is it that it is possible to have direct access to the quantization error of the modulator (i.e. the difference between the input signal and the digitized modulator output). In conventional modulators this signal is not readily available, thus access to the quantization error voltage enables the following architectures which could be implemented in any one of or more combinations. In particular, the quantization error can be digitized by another ADC and combined after some DSP with the output of the modulator to result in a signal that has less quantization error than that of the modulator output. This allows the quantization error to be monitored (either digitally through an ADC or analog otherwise) to modify various aspects of the modulator 100. For example the shape of the NTF can be modified to maintain performance, and stability over e.g. temperature, process, or supply variations. As another example, the quantization error can be also monitored to measure various non-idealities in the modulator and there upon produce a calibrating signal. As yet another example, a calibration signal can be injected into the modulator at the quantizer input and since the quantization error signal has the input signal substantially removed from it can be used to easily and quickly determine the non-idealities in the design (e.g. mismatch in the feedback DAC) and thus enable a digital compensation of the non-idealities. It is to be appreciated that the access to the quantization error can be used to create an additional degree of freedom to compensate the excess loop delay in a continuous time delta-sigma modulator.

The above-described embodiments of the invention are intended to be examples of the present invention and alterations and modifications may be effected thereto, by those of skill in the art, without departing from the scope of the invention which is defined solely by the claims appended hereto.

We claim:

1. A delta-sigma modulator configured to digitize an input analog signal, the delta-sigma modulator comprising:
    a two port network device for receiving the input analog signal and outputting a first output analog signal;
    a feedback DAC for receiving a digital input signal and outputting a second output analog signal, wherein the first output analog signal and the second output analog signal combine to form an integrator input voltage;
    a first stage integrator generating a scaled integral voltage of the integrator input voltage, the first stage integrator including a substantially non-linear integrator that includes a Gm cell loaded by a capacitor; and
    a virtual ground node formed by connecting the two port network device, the feedback DAC, and the first stage integrator, the virtual ground node configured to reduce swing and improve linearity.

2. The delta-sigma modulator of claim 1, wherein the two port network device comprises an impedance.

3. The delta-sigma modulator of claim 2, wherein the impedance is a resistor.

4. The delta-sigma modulator of claim 2, wherein the impedance is a capacitor.

5. The delta-sigma modulator of claim 1, wherein the two port network device comprises a transimpedance.

6. The delta-sigma modulator of claim 5, wherein the transimpedance is a Gm cell.

7. The delta-sigma modulator of claim 1, wherein the feedback DAC includes a voltage-in, voltage-out DAC and a second two port network device.

8. The delta-sigma modulator of claim 7, wherein the output of the feedback DAC is a current.

9. The delta-sigma modulator of claim 7, wherein the output of the feedback DAC is electrical charge.

10. The delta-sigma modulator of claim 7, wherein the output of the feedback DAC is a voltage.

11. The delta-sigma modulator of claim 1, further comprising an ADC connected to the virtual ground node, the ADC configured to digitize a quantization error.

12. The delta-sigma modulator of claim 11, wherein the ADC is a delta-sigma modulator.

13. The delta-sigma modulator of claim 11, further comprising a DSP connected to the ADC, the DSP configured to receive a signal from the ADC, the DSP configured to reduce the quantization error.

14. The delta-sigma modulator of claim 13, wherein the DSP is configured to modify a NTF.

15. The delta-sigma modulator of claim 13, further comprising a signal generator for injecting a test calibration signal into the delta-sigma modulator.

16. The delta-sigma modulator of claim 15, wherein the DSP is configured to detect a non-ideality using the test calibration signal and to compensate for the non-ideality.

17. A delta-sigma modulator configured to digitize an input analog signal, the delta-sigma modulator comprising:
    a two port network device for receiving the input analog signal and outputting a first output analog signal;
    a feedback DAC for receiving a digital input signal and outputting a second output analog signal, wherein the first output analog signal and the second output analog signal combine to form an integrator input voltage;
    a first stage integrator generating a scaled integral voltage of the integrator input voltage;
    a virtual ground node formed by connecting the two port network device, the feedback DAC, and the first stage integrator, the virtual ground node configured to reduce swing and improve linearity;
    an ADC connected to the virtual ground node, the ADC being configured to digitize a quantization error; and
    a DSP connected to the ADC, the DSP configured to receive a signal from the ADC, the DSP being configured to reduce the quantization error, the DSP further being configured to modify a NTF.

18. The delta-sigma modulator of claim 17, wherein the two port network device comprises an impedance.

19. The delta-sigma modulator of claim 18, wherein the impedance is a resistor.

20. The delta-sigma modulator of claim 18, wherein the impedance is a capacitor.

21. The delta-sigma modulator of claim 17, wherein the two port network device comprises a transimpedance.

22. The delta-sigma modulator of claim 21, wherein the transimpedance is a Gm cell.

23. The delta-sigma modulator of claim 17, wherein the feedback DAC includes a voltage-in, voltage-out DAC and a second two port network device.

24. The delta-sigma modulator of claim 23, wherein the output of the feedback DAC is a current.

25. The delta-sigma modulator of claim 23, wherein the output of the feedback DAC is electrical charge.

26. The delta-sigma modulator of claim 23, wherein the output of the feedback DAC is a voltage.

27. The delta-sigma modulator of claim 17, wherein the ADC is a delta-sigma modulator.

28. The delta-sigma modulator of claim 17, further comprising a signal generator for injecting a test calibration signal into the delta-sigma modulator.

29. The delta-sigma modulator of claim 28, wherein the DSP is configured to detect a non-ideality using the test calibration signal and to compensate for the non-ideality.

30. A delta-sigma modulator configured to digitize an input analog signal, the delta-sigma modulator comprising:
    a two port network device for receiving the input analog signal and outputting a first output analog signal;
    a feedback DAC for receiving a digital input signal and outputting a second output analog signal, wherein the first output analog signal and the second output analog signal combine to form an integrator input voltage;

a first stage integrator generating a scaled integral voltage of the integrator input voltage;

a virtual ground node formed by connecting the two port network device, the feedback DAC, and the first stage integrator, the virtual ground node configured to reduce swing and improve linearity;

an ADC connected to the virtual ground node, the ADC being configured to digitize a quantization error;

a DSP connected to the ADC, the DSP configured to receive a signal from the ADC, the DSP being configured to reduce the quantization error; and a signal generator for injecting a test calibration signal into the delta-sigma modulator.

31. The delta-sigma modulator of claim 30, wherein the two port network device comprises an impedance.

32. The delta-sigma modulator of claim 31, wherein the impedance is a resistor.

33. The delta-sigma modulator of claim 31, wherein the impedance is a capacitor.

34. The delta-sigma modulator of claim 30, wherein the two port network device comprises a transimpedance.

35. The delta-sigma modulator of claim 34, wherein the transimpedance is a Gm cell.

36. The delta-sigma modulator of claim 30, wherein the feedback DAC includes a voltage-in, voltage-out DAC and a second two port network device.

37. The delta-sigma modulator of claim 36, wherein the output of the feedback DAC is a current.

38. The delta-sigma modulator of claim 36, wherein the output of the feedback DAC is electrical charge.

39. The delta-sigma modulator of claim 36, wherein the output of the feedback DAC is a voltage.

40. The delta-sigma modulator of claim 30, wherein the ADC is a delta-sigma modulator.

41. The delta-sigma modulator of claim 30, wherein the DSP is configured to detect a non-ideality using the test calibration signal and to compensate for the non-ideality.

42. A delta-sigma modulator configured to digitize an input analog signal, the delta-sigma modulator comprising:

a two port network device for receiving the input analog signal and outputting a first output analog signal, the two port network device including an impedance that includes a capacitor;

a feedback DAC for receiving a digital input signal and outputting a second output analog signal, wherein the first output analog signal and the second output analog signal combine to form an integrator input voltage;

a first stage integrator generating a scaled integral voltage of the integrator input voltage; and a virtual ground node formed by connecting the two port network device, the feedback DAC, and the first stage integrator, the virtual ground node configured to reduce swing and improve linearity.

* * * * *